(12) United States Patent
Ziaja et al.

(10) Patent No.: US 8,065,572 B2
(45) Date of Patent: Nov. 22, 2011

(54) AT-SPEED SCAN TESTING OF MEMORY ARRAYS

(75) Inventors: Thomas A. Ziaja, Austin, TX (US); Murali Gala, San Jose, CA (US); Paul J. Dickinson, San Jose, CA (US); Karl P. Dahlgren, Evemont, CA (US); David L. Curwen, Mountain View, CA (US); Oliver Caty, Sunnyvale, CA (US); Steven C. Krow-Lucal, Sunnyvale, CA (US); James C. Hunt, Redwood City, CA (US); Poh-Joo Tan, San Jose, CA (US)

(73) Assignee: Oracle America, Inc., Redwood City, CA (US)

( * ) Notice: Subject to any disclaimer, the term of this patent is extended or adjusted under 35 U.S.C. 154(b) by 189 days.

(21) Appl. No.: 12/495,158

(22) Filed: Jun. 30, 2009

(65) Prior Publication Data

US 2010/0332924 A1 Dec. 30, 2010

(51) Int. Cl.
*G11C 29/00* (2006.01)
*G01R 31/28* (2006.01)

(52) U.S. Cl. ........ 714/718; 714/719; 714/720; 714/726; 714/727; 714/729

(58) Field of Classification Search .................. None
See application file for complete search history.

(56) References Cited

U.S. PATENT DOCUMENTS

| | | | |
|---|---|---|---|
| 5,761,215 A | 6/1998 | McCarthy et al. | |
| 5,796,745 A * | 8/1998 | Adams et al. | 714/718 |
| 6,014,762 A | 1/2000 | Sanghani et al. | |
| 6,341,092 B1 | 1/2002 | Agrawal | |
| 7,249,295 B2 * | 7/2007 | Fukuyama et al. | 714/718 |
| 7,502,976 B2 * | 3/2009 | Ross et al. | 714/718 |
| 7,574,642 B2 * | 8/2009 | Ferguson et al. | 714/733 |
| 7,617,425 B2 * | 11/2009 | Nadeau-Dostie et al. | 714/719 |
| 7,689,897 B2 * | 3/2010 | Priel et al. | 714/814 |
| 7,761,754 B1 * | 7/2010 | Ang et al. | 714/718 |
| 2004/0097093 A1 * | 5/2004 | Fukuyama et al. | 438/735 |
| 2004/0250165 A1 * | 12/2004 | Tanizaki | 714/30 |
| 2006/0156133 A1 * | 7/2006 | Mukherjee et al. | 714/733 |
| 2007/0022343 A1 * | 1/2007 | Urata et al. | 714/727 |
| 2007/0061644 A1 * | 3/2007 | Birmiwal et al. | 714/726 |
| 2008/0304343 A1 * | 12/2008 | Yoshihara | 365/201 |
| 2009/0022000 A1 * | 1/2009 | Sannomiya | 365/201 |
| 2009/0150729 A1 * | 6/2009 | Parulkar et al. | 714/719 |
| 2010/0037109 A1 * | 2/2010 | Nadeau-Dostie et al. | 714/719 |

* cited by examiner

*Primary Examiner* — Jeffrey A Gaffin
*Assistant Examiner* — Guerrier Merant
(74) *Attorney, Agent, or Firm* — Meyertons, Hood, Kivlin, Kowert & Goetzel, P.C.; Erik A. Heter

(57) ABSTRACT

An integrated circuit configured for at-speed scan testing of memory arrays. The integrated circuit includes a scan chain having a plurality of serially coupled scan elements, wherein a subset of the plurality of scan elements are coupled to provide signals to a memory array. Each scan element of the subset of the plurality of scan elements includes a flip flop having a data input, and a data output coupled to a corresponding input of the memory array, and selection circuitry configured to, in an operational mode, couple a data path to the data input, and further configured to, in a scan mode, couple to the data input one of a scan input, the data output, and a complement of the data output. The scan elements of the subset support at-speed testing of a memory array coupled thereto.

18 Claims, 6 Drawing Sheets

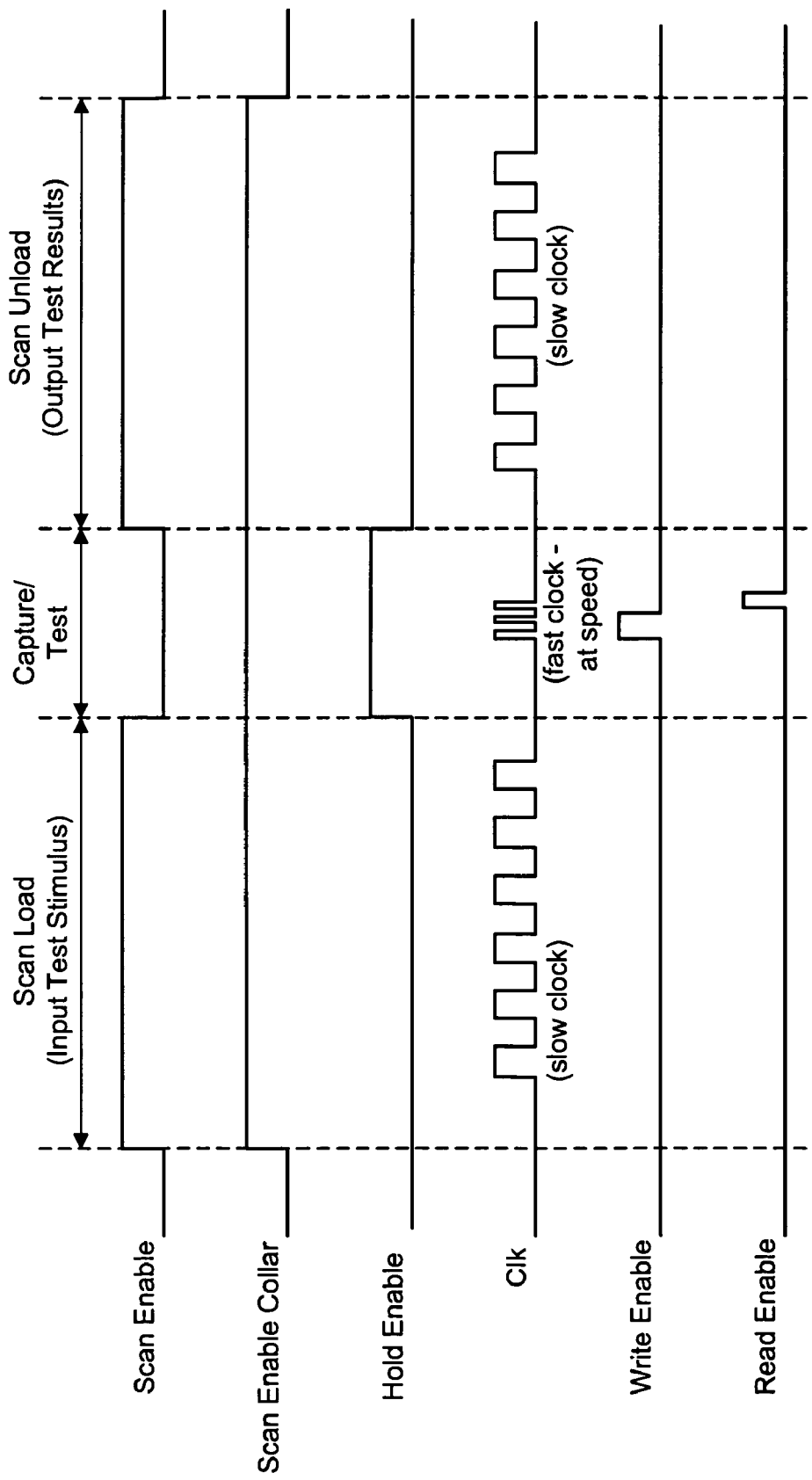

AT-SPEED SCAN TESTING OF MEMORY ARRAYS

BACKGROUND OF THE INVENTION

1. Field of the Invention

This invention relates to memory circuits, and more particularly, the testing of memory circuits.

2. Description of the Related Art

Memory arrays on integrated circuits may be tested using different test mechanisms. One such mechanism is a memory built-in self-test (MBIST). Memory testing using this mechanism is implemented with a controller that is coupled to the memory array (or arrays) to be tested. The controller may generate various types of test patterns in which data is written to and read from the memory, wherein the reading of data may be used to verify whether or not the memory passes a given test. The controller may convey signals to the memory over address lines, data lines, and control lines (e.g., read enable, write enable, bank enable), and may receive signals over data lines as well. Thus, the controller may test the functionality of the entire memory array, including address and control circuitry, as well as testing individual memory cells. The controller may also provide signals to devices external to the integrated circuit in which the memory array is implemented in order to indicate the results of a particular test.

Scan testing is another mechanism that may be used in memory testing. Scan chains may be formed around the inputs and outputs of the memory array. Test input data may be shifted into the scan chain. After the shifting of input data is complete, one or more capture cycles are conducted to allow data to be written into and read from the memory array. The data read from the memory array (test output data) may then be shifted, via the scan chain, from the integrated circuit in which the memory array is implemented. The test output data may then be analyzed by a test system to determine whether the particular test passed or failed. In many cases, the speed at which scan testing of memory arrays is conducted may be significantly lower than the speed at which the integrated circuit is intended to operate.

SUMMARY OF THE INVENTION

An integrated circuit configured for at-speed scan testing of memory arrays is disclosed. In one embodiment, an integrated circuit includes a scan chain having a plurality of serially coupled scan elements, wherein a subset of the plurality of scan elements are coupled to provide signals to a memory array. Each scan element of the subset of the plurality of scan elements includes a flip flop having a data input, and a data output coupled to a corresponding input of the memory array, and selection circuitry configured to, in an operational mode, couple a data path to the data input, and further configured to, in a scan mode, couple to the data input one of a scan input, the data output, and a complement of the data output.

A method for at-speed scan testing of memory arrays is also provided. In one embodiment, the method includes loading test stimulus data into a scan chain of an integrated circuit (IC), the scan chain having a plurality of serially coupled scan elements each including a flip-flop having a data input and a data output, wherein said loading includes loading a initial test stimulus data into a subset of the plurality of scan elements, wherein each scan element of the subset is coupled to provide signals for input into a memory array. The method further includes initiating a memory test operation by providing the initial test stimulus data from the subset of the plurality of scan elements to the memory array. Additional test stimulus data is provided to the memory array for a plurality of clock cycles by coupling to the data input of each scan element of the subset one of the data output or a complement of the data output, wherein the test operation is performed at an operational clock speed of the memory array.

BRIEF DESCRIPTION OF THE DRAWINGS

Other aspects of the invention will become apparent upon reading the following detailed description and upon reference to the accompanying drawings in which:

FIG. 6 is a timing diagram illustrating states of various signals during scan test operations performed on one embodiment of an integrated circuit.

Figure 1:
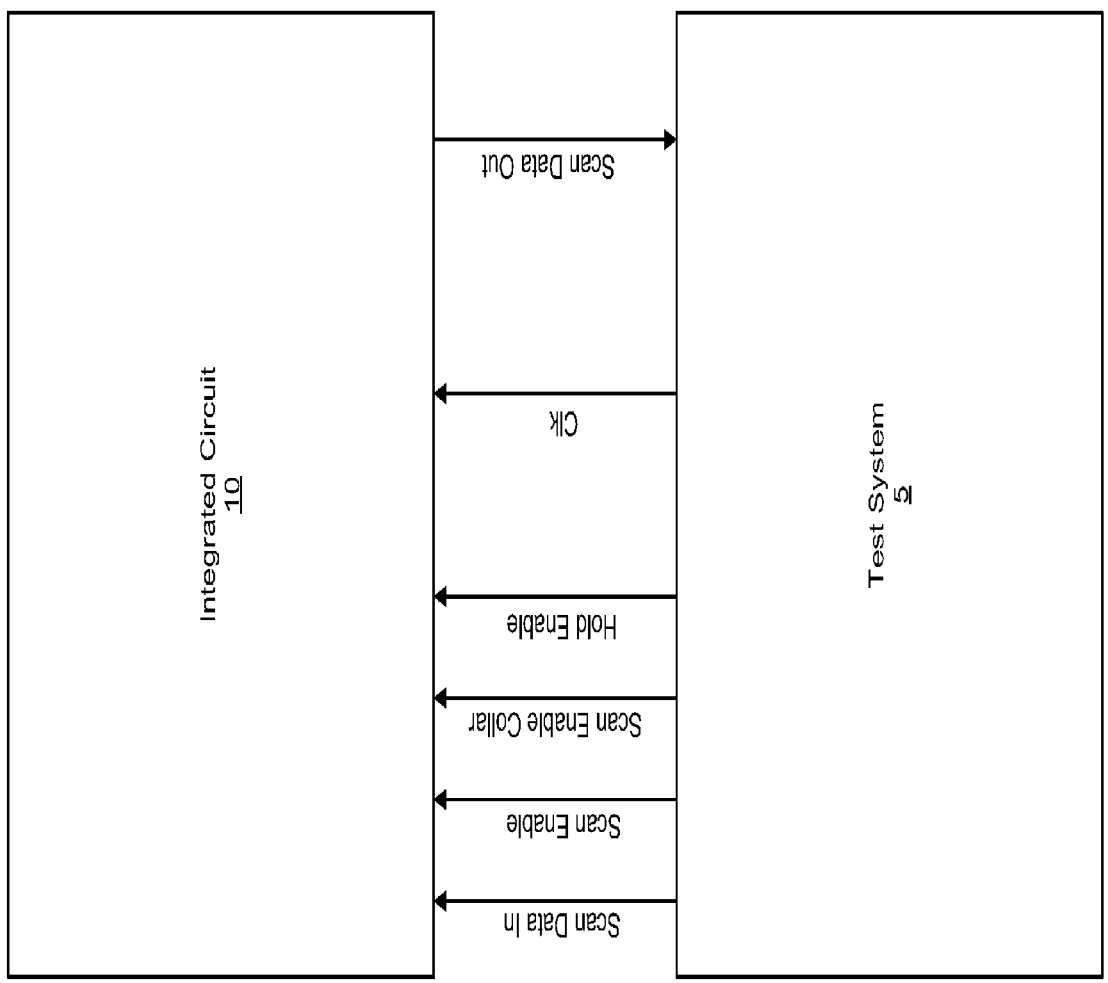
FIG. 1 is a block diagram of one embodiment of a tester coupled to an integrated circuit for scan testing.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Turning now to FIG. 1, a block diagram of one embodiment of a tester coupled to an integrated circuit (IC) for scan testing is shown. In the embodiment shown, test system 5 is coupled to input test stimulus data into and to receive test output data from IC 10. In this particular embodiment, IC 10 is an integrated circuit including one or more internal scan chains and is thus configured for scan testing.

Test stimulus data may be input from test system 5 into IC 10 through the input labeled 'Scan Data In'. The test stimulus data may be input serially (i.e. shifted) in accordance with the scan chain implemented in IC 10. After test result data has been captured, it may be shifted from IC 10 into test system 5 through the output labeled 'Scan Data Out'. Test result data, after being shifted from IC 10 back into test system 5, may be analyzed to determine whether or not IC 10 meets the specifications of the test (e.g., whether or not IC 10 passed or failed). During shifting operations (i.e. inputting test stimulus data or outputting test result data), a scan enable signal ('Scan Enable') may be asserted. When the scan enable signal is asserted, data may be shifted serially into IC 10 or serially from IC 10 through the elements of the scan chain therein. The shifting operation may be synchronized using a clock signal conveyed from test system 5 into the IC 10 via the clock input ('Clk').

Since some embodiments of IC 10 may have multiple scan chains, multiple test data inputs may be present (with corresponding connections to test system 5). Similarly, multiple test result outputs may also be present in embodiments of IC 10 having multiple scan chains. Alternatively, embodiments having multiple scan chains may have a single test input and a single test output, accompanied by selection circuitry in order to route the test stimulus input data and test result output data to/from the appropriate scan chains.

IC 10 may include at least one memory (not shown in this particular drawing). The memory may include inputs (e.g., one or more write ports, address inputs, control inputs) that may be coupled to corresponding ones of a subset of scan elements of a scan chain within IC 10. Accordingly, the scan chain may be used to input test stimulus data that may be used for testing the memory. Additional circuitry that supports at-speed testing of the memory based on test stimulus data input through the scan chain may also be present (i.e. at the normal operational clock speed of the memory). Various input signals (e.g., data signals, address signals, control signals) may be input into the memory from particular scan elements of the scan chain that are configured to support at-speed testing. This circuitry may require a different enable signal than other scan elements. Accordingly, a separate scan enable signals ('Scan Enable Collar') may be provided to the particular scan elements. A hold signal ('Hold Enable') may also be provided to the particular scan elements that enable the aforementioned at-speed testing. Examples of circuitry that supports at-speed testing of the memory via a scan chain will be discussed in further detail below.

As previously noted, test system 5 is coupled to provide a clock signal to IC 10. The clock signal may be used to synchronize the shifting involved with loading test stimulus data and the shifting involved with unloading test result data. The clock signal may also be used as a source clock signal for at-speed testing of the memory. In one embodiment, test system 5 may be configured to provide the clock signal at-speed for such test operations. In another embodiment, IC 10 may include a phase locked loop (PLL) or other type of clock generation circuitry coupled to receive the clock signal from test system 5. Such clock generation circuitry may then generate the at-speed clock signal based on the clock signal received from test system 5. The clock signal used for shift operations (loading or unloading) may have a different (e.g., lower) frequency than the at-speed clock signal.

Figure 2:
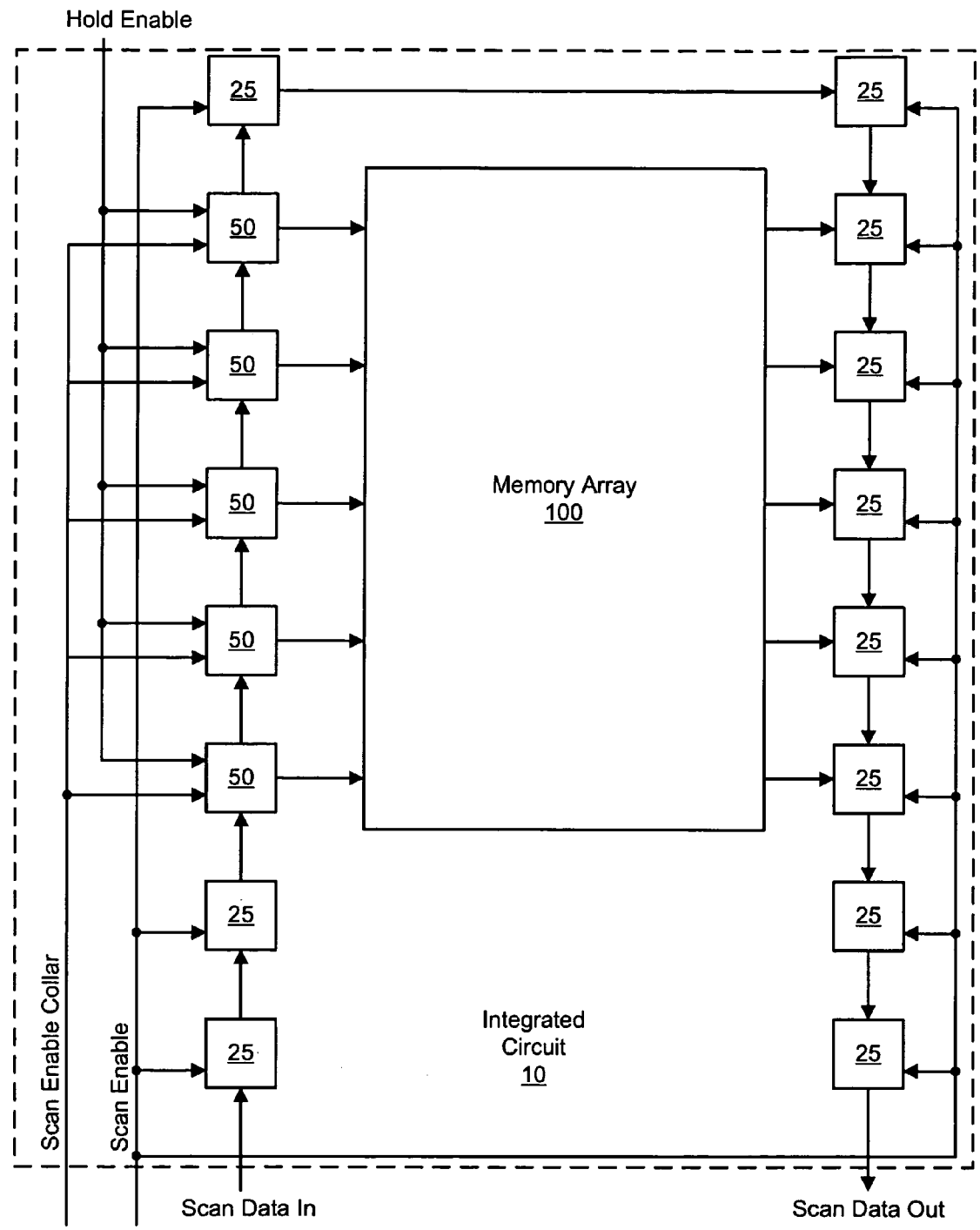
FIG. 2 is a block diagram of one embodiment of an integrated circuit including a memory array and a scan chain.

FIG. 2 is a block diagram of one embodiment of an integrated circuit including a memory array and an exemplary scan chain. More particularly, FIG. 2 illustrates an embodiment of IC 10 including a memory array 100 and a scan chain formed of scan elements 25 and scan elements 50. Memory array 100 may be any type of memory array. In one embodiment, memory array 100 may be a cache memory implemented in a processor (wherein IC 10 is a processor). However, IC 10 may be virtually any type of integrated circuit having a memory array implemented therein, while memory array 100 may be implemented using any type of memory.

Test stimulus data may be input into IC 10 via the scan chain by serially shifting bits thereof from one scan element (25 or 50) to the next. The test stimulus data may be provided bit-by-bit into the input 'Scan Data In', with each bit being shifted through elements of the scan chain until all test stimulus data has been loaded. Similarly, test result data, captured by various ones of scan elements 25 and/or 50, may be shifted from IC 10 via the scan chain by serially shifting bits from one scan element to another. The test result data may be received by test system 5 from the output labeled 'Scan Data Out'. Certain ones of the scan elements (scan elements 50) are coupled to provide a corresponding input signal into memory array 100. Using the scan elements 25 and 50 of the scan chain, test stimulus data for testing the memory array may be input into IC 10. Similarly, various ones of scan elements 25 are coupled to receive signals (in the form of test result data) from memory array. Thus, the scan chain may also be used for shifting captured memory test data from IC 10.

Each of scan elements 25 may be used in a normal scan testing scenario. More particularly, particular ones of scan elements 25 may be coupled to other logic circuitry (not shown), and may be coupled to provide test stimulus data to logic circuits coupled thereto. Scan elements 25 may also be coupled to capture test result data from logic circuits similarly coupled. Each of scan elements 25 in the embodiment shown is coupled to receive the scan enable signal. This signal may enable scan elements 25 during shift operations. During the actual test operations, the scan enable signal may be de-asserted. Test operations involving scan elements 25 may include (after de-asserting the scan enable signal) providing a clock pulse to convey test stimulus data from various ones of scan elements 25 to various logic circuits, and providing another clock pulse to enable various ones of scan elements 25 to capture test result data. After test result data has been captured by scan elements 25, the scan enable signal may be asserted once again, and the test result data can then be shifted out of IC 10 into a test system (e.g., test system 5) for further analysis. In some embodiments, scan elements 25 may be of the multiplexer-D ('mux-D') type scan elements (a multiplexer coupled to a D flip-flop), while other embodiments are possible and contemplated wherein scan elements 25 are LSSD (level sensitive scan design) scan elements.

Scan elements 50, which comprise a subset of the scan elements shown in this embodiment, are coupled to inputs of memory array 100 (e.g., to a write port, to address inputs, to control signal inputs). These scan elements may be configured differently than scan elements 25. As will be explained in further detail below, each of scan elements 50 may incorporate a hold function that allows data from the output(s) of a respective scan element to be re-circulated back to its input. Accordingly, each of scan elements 50 in the embodiment shown may be loaded with test stimulus data for a single instance, but may provide test stimulus data to memory array 100 for multiple clock cycles. This in turn may enable the testing of memory array to be conducted at-speed, i.e. at the operational clock speed of the memory over a number of clock cycles.

Because of the configuration of scan elements 50, different control signals may be required. In this particular embodiment, each of scan elements 50 is coupled to receive a scan enable signal ('Scan Enable Collar') that is separate from the scan enable signal provided to scan elements 25. This separate scan enable signal provided to scan elements 50 may remain asserted during the entire scan testing operation, including during the capture phase. Furthermore, the hold enable signal ('Hold Enable') may be asserted during the capture phase in order to enable the re-circulation function, which will be described below.

As shown in FIG. 2, particular ones of scan elements 25 are coupled to receive data from memory array 100 (e.g., coupled to a read port). These particular ones of scan elements 25 may be used to capture data that is read from memory array 100 as part of a test operation. This data may be referred to as test result data for the test of memory array 100, and may be shifted out of IC 10 through the scan chain into test system 5 for further analysis (e.g., a pass/fail determination).

Figure 3:
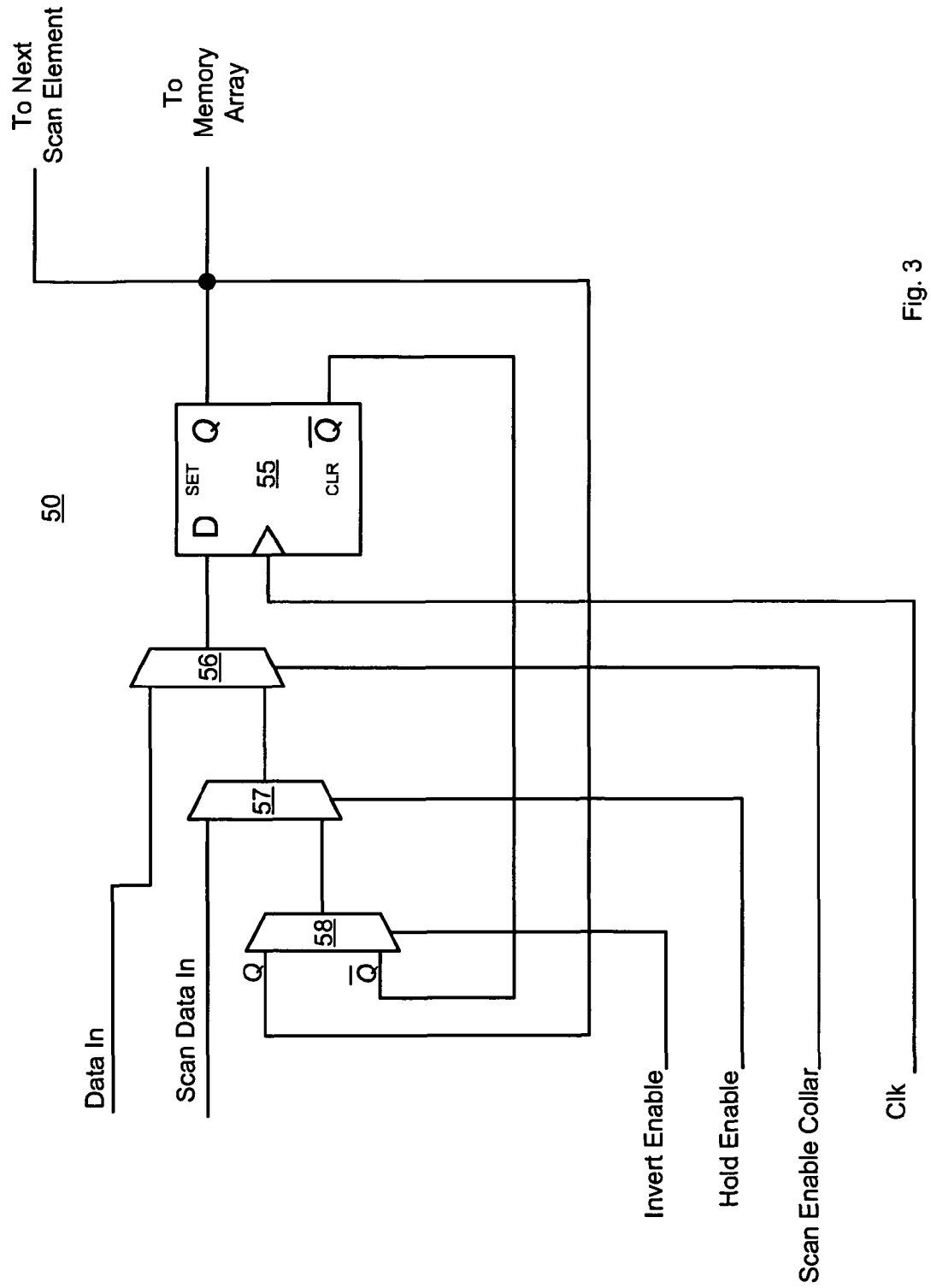
FIG. 3 is a schematic diagram of one embodiment of a scan element used to input data into a memory array for testing.

FIG. 3 is a schematic diagram of one embodiment of a scan element used to input data into a memory array for testing. In the embodiment shown, scan element 50 includes a flip-flop 55 and selection circuits 56, 57, and 58. Scan element 50 further includes a data input ('Data In'), a scan data input ('Scan Data In'), a clock signal input ('Clk'), and a plurality of enable signal inputs ('Invert Enable', 'Hold Enable', and 'Scan Enable Collar'). Based on the states of the enable signals, one of the data input, the scan data input, or one of the flip-flop 55 outputs (i.e. the true output Q or the complementary output Q-bar) may be coupled to the D input of flip-flop 55.

During normal operations of the IC in which scan element 50 is implemented, each of the enable signals may be de-asserted. In the embodiment shown, when the signal on the 'Scan Enable Collar' input is in a de-asserted state, selection circuit 56 couples the data input to the D input of flip-flop 55. Furthermore, during normal operation, the clock signal may operate at a normal operational frequency, previously referred to as 'at-speed'. The data input may be coupled to other circuitry that may provide various types of signals to memory array 100 (e.g., data signals, control signals, address signals).

In the embodiment shown, the scan data input is coupled to the D input of flip-flop 55 during the loading of test stimulus data. This may be accomplished by asserting the signal on the scan enable collar input, while the signals on the hold enable and invert enable inputs remain de-asserted. Asserting the signal on the scan enable collar input may cause selection circuit 56 to select the output from selection circuit 57, which in turn may select the scan data input (since the signal on the hold enable input remains de-asserted). The scan data input of scan element 50 may be coupled to a previous scan element in the scan chain (e.g., another instance of scan element 50, or an instance of scan element 25), or in some cases, may be coupled to a scan data input of the IC in which it is implemented. The signal received on the scan data input may be conveyed into the D input of flip-flop 55, which may then store its corresponding logic value. When scan shifting operations are in effect, the true output Q may convey, responsive to the next clock cycle, a signal having the logic value of the input signal stored by flip-flop 55 during the previous clock cycle.

After the loading of test stimulus data is complete, test operations may begin. During a first cycle of a test operation, a logic signal having the logic value most recently stored in flip-flop 55 may be conveyed to memory array 100. Furthermore, during test operations, scan element 50 may begin re-circulating data. This may be accomplished by asserting the signal on the hold enable input, while the signal on the scan enable collar input remains asserted. In the embodiment shown, when signals present on both the scan enable collar and hold enable inputs are asserted, selection circuit 56 selects the output of selection circuit 57, while selection circuit 57 selects the output of selection circuit 58. Accordingly, during clock cycles subsequent to the first clock cycle of a test operation, one of the true (Q) or complementary (Q-bar) outputs of flip-flop 55 is coupled to its D input, via selection circuits, 58, 57, and 56. If the signal on the invert enable input is de-asserted, selection circuit may allow the true output of flip-flop 55 to be coupled to the D input via the selection circuits 56-58. Otherwise, when the signal on the scan enable input is asserted, the complementary output of flip-flop 55 may be coupled to the D input via selection circuits 56-58. One example of an apparatus configured to provide invert enable signals will be discussed below with reference to FIG. 4.

The ability to couple the true or complementary output of flip-flop 55 to its D input may therefore allow test stimulus data to be re-circulated (and, depending on the invert enable signal, inverted as well). Accordingly, scan element 50 may be usable to provide test stimulus data to memory array 100 for a plurality of clock cycles (instead of just one as with a normal scan element). This may in turn enable scan element 50 to support testing for a plurality of clock cycles based on a single load of test stimulus data, as well as supporting at-speed testing of the memory array coupled thereto.

It is noted that while the configuration of scan element 50 shown in FIG. 3 conforms to the mux-D scan element design, embodiments are possible and contemplated wherein such a scan element may be implemented using LSSD elements. The contemplated LSSD elements may be similarly configured to support the operations of scan element 50 as discussed above. It should also be noted, with respect to scan element 50 of FIG. 4, alternative embodiments may utilize an inverter having an input coupled to the true output of flip-flop 55 in order to generate the complementary output.

Figure 4:
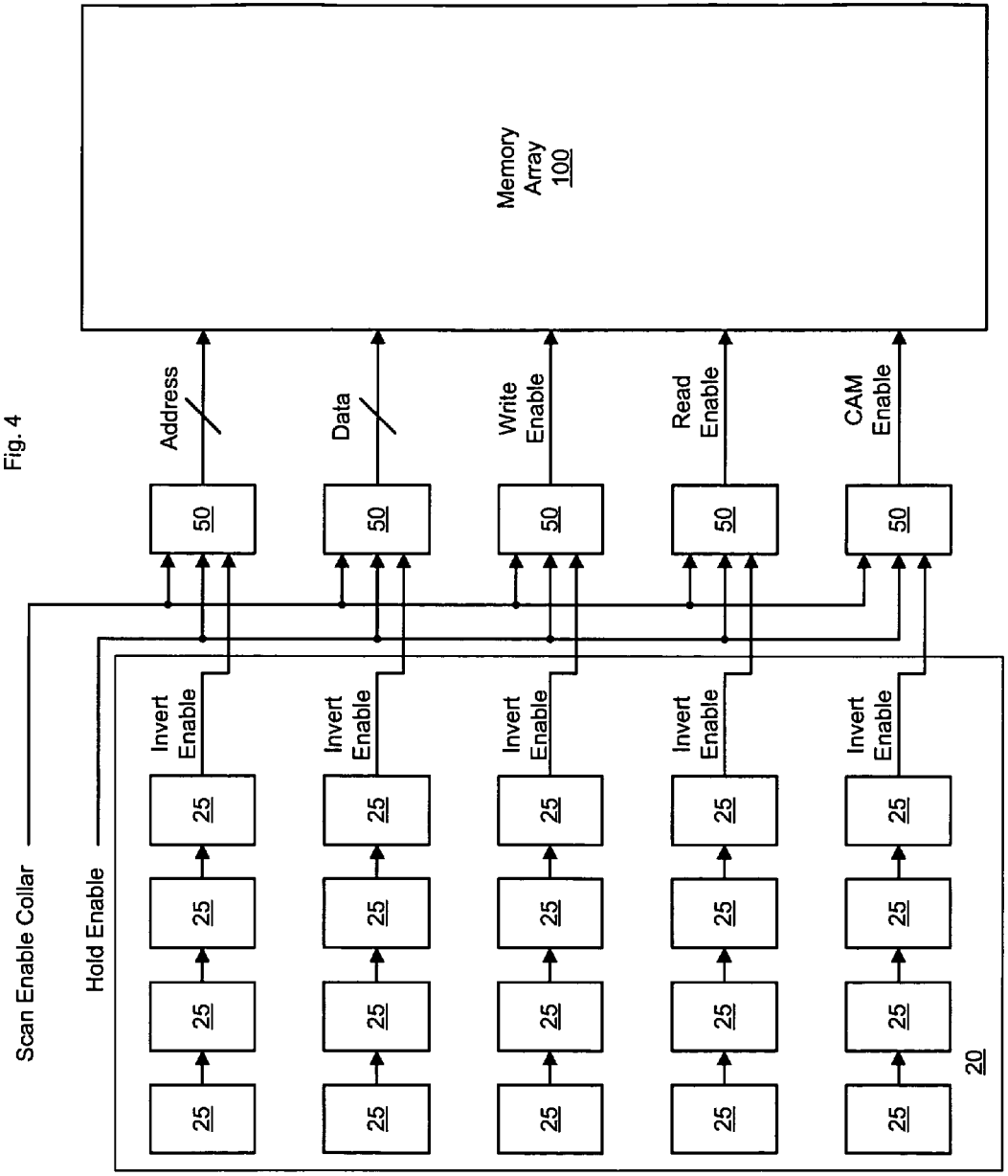
FIG. 4 is a block diagram of one embodiment of an integrated circuit including a scan chain, a memory array, and a control circuit coupled to certain ones of the scan elements.

FIG. 4 is another block diagram of an embodiment of IC 10 including scan elements coupled to provide input signals to a memory array for memory testing. In the embodiment shown, each of scan elements 50 is coupled to shift register bank 20. In this example, shift register bank 20 implements a plurality of shift registers, each of which is formed of a plurality of serially coupled scan elements 25. In other embodiments, the shift registers may be implemented using flip-flops or any other type of circuitry suitable for implementing shift registers.

In this particular embodiment, scan elements 50 are provided for address signals, data signals, a write enable signal, a read enable signal, and a CAM (content addressable memory) enable signal. Some of these signals may be eliminated from certain embodiments. For example, no CAM enable signal is required for an embodiment of memory array 100 that is not content addressable. It is also noted that while only one instance each of scan elements 50 corresponding to address and data signals are shown, multiple instances of each may be present. It is also noted that each of scan elements 50 are coupled to receive signals via respective scan enable collar inputs and hold enable inputs. Signals provided on these inputs may provide the same function as described above with reference to FIG. 3. Accordingly, during test operations, signals may be asserted on both the hold enable and scan enable collar inputs during test operations.

In some embodiments, each of scan elements 25 shown in FIG. 4 may be part of the same scan chain as scan elements 50 shown herein. In other embodiments, the scan elements 25 of FIG. 4 may be part of a different scan chain, despite the shift registers being coupled to provide invert enable signals to scan elements 50. Each of the scan elements 25 may be loaded with data during shift operations. The data loaded into scan elements 25 of shift register bank 20 may indicate the required states of the invert enable signals provided to the corresponding scan elements 50. When test operations commence, logic values stored in these particular scan elements 25 may be shifted in order to feed invert enable signal states to scan elements 50. Based on a received invert enable signal, a corresponding one of scan elements 50 may either invert the re-circulated data (i.e. couple the complementary output to the D input) or not invert the re-circulated data (i.e. couple the true output to the D input). For example, using the embodiment shown in FIG. 3, coupling the complementary output of a scan element 50 to its D input may be accomplished by providing the logic value of the Q-bar output of flip-flop 55 to the Q input of selection circuit 58, and further configuring selection circuits 57 and 56 such that this logic value is routed back to the D input of flip-flop 55. Similarly (and referring again to FIG. 3), coupling the true output of scan element 50 to its D input may be accomplished by providing the logic value of the Q output of flip-flop 55 to the Q input of selection circuit 58, and further configuring selection circuits 57 and 56 such that this logic value is routed back to the D input of flip-flop 55.

Thus, in accordance with the above, scan elements 50 may provide various sequences of logic 1's and logic 0's to memory array 100, based on the logic values loaded into the scan elements 25 of shift register bank 20. In the embodiment shown, these sequences are programmable based on the logic values initially loaded into scan elements 50 and the values loaded into scan elements 25 of shift register bank 20.

The embodiment shown in FIG. 4 may allow for a high degree of flexibility in designing tests for memory array 100. For example, utilizing invert enable data loaded into scan elements 25 and initial test stimulus data loaded into scan elements 50, a test including a plurality of writes to different addresses of memory array 100 followed by a subsequent read may be performed. Referring back to FIG. 2, during a read operation, data may be read and captured by those scan elements 25 that are coupled to receive data from memory. Furthermore, these tests may be performed at the operational clock speed of memory array 100 ('at-speed').

While the embodiment shown in FIG. 4 utilizes shift register bank 20 in order to provide invert enable signals to scan elements 50, it is noted that embodiments utilizing other arrangements are possible and contemplated. For example, embodiments are possible and contemplated wherein invert enable signals are provided from an external source, such as test system 5 discussed with reference to FIG. 1. In another embodiment, a read only memory (ROM) may be programmed with sequences of logic 1's and logic 0's that may be provided to the invert enable inputs of scan elements 50. In general, any suitable arrangement for generating and/or providing logic sequences to the invert enable inputs of scan elements 50 may be utilized. Since these sequences may provide signals that alternately cause the coupling of the Q output or the Q-bar output of a respective flip-flop 55 to its corresponding D input, scan elements 50 may in turn be operated to provide alternating sequences of logic 1's and logic 0's to memory array 100. A particular sequence of logic 1's and logic 0's provided by a scan element 50 to memory array 100 may depend upon the initially loaded test stimulus data as well as the sequence provided to its respective invert enable input.

Figure 5:
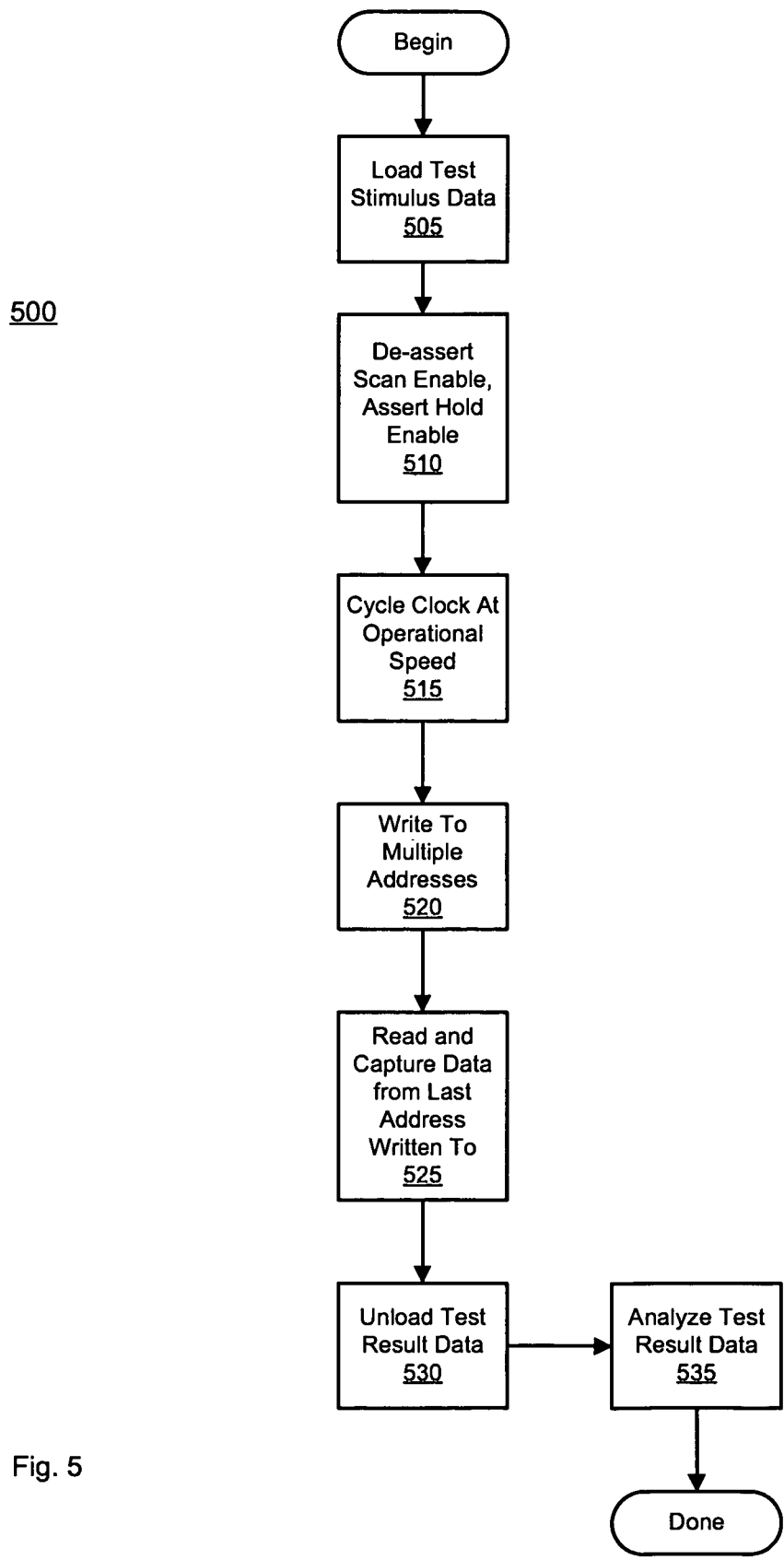
FIG. 5 is a flow diagram of one embodiment of a method for at-speed testing of a memory array using test stimulus data loaded through a scan chain.

Turning now to FIG. 5, a flow diagram of one embodiment of a method for at-speed testing of a memory array using test stimulus data loaded through a scan chain. Discussion of method 500 will include references to various hardware elements (e.g., scan elements 50, memory array 100, etc.) previously discussed above. However, various embodiments of the method described herein may be applied to any suitable circuit arrangement.

In the embodiment shown, method 500 begins with the loading of test stimulus data (block 505). The loading of test stimulus data may include the loading of data into a scan chain that includes scan elements 50 and may also include loading of data into a scan chain including scan elements of shift register bank 20. Accordingly, the test stimulus data loaded into the one or more scan chains may include initial test stimulus data to be provided from scan elements 50 to memory array 100, as well as data indicating desired states of the invert enable signals for each particular test cycle.

As noted above in the discussions of FIGS. 1 and 2, two different scan enable signals may be asserted during shift operations. The first of these signals ('Scan Enable') may be provided to the standard scan elements 25, while the second of these signals ('Scan Enable Collar') is provided to the scan elements 50 that are coupled to the memory array 100. After shift operations have completed, the first scan enable signal may be de-asserted, while the hold signal is asserted and the scan enable collar signal remains asserted (block 510).

Subsequent to asserting the hold enable signal, test operations may begin. Test operations include the cycling of the clock signal provided to memory array 100 at the operational clock speed of memory array 100 (block 515). The operational clock speed is a frequency at which the clock signal provided to memory array 100 may operate when the IC is in its target system performing its intended function. Since some IC's may use multiple operational clock frequencies (e.g., in different operational modes), the highest of these frequencies may be used for testing purposes to ensure that any faults present are not masked by lower-speed operation. Some faults may be intermittent faults that do not occur at lower clock speeds, thus testing at the highest operational clock frequency in multi-frequency embodiments may expose such faults.

With the clock operating at-speed, the method may commence writing data to multiple addresses of memory array 100 (block 520). Following the writing of data to multiple addresses, a read operation may result in reading and capturing (in scan elements) data from the last address written to (block 525). In other embodiments, the address from which data is read may be one other than the last address written to (e.g., the first address written to). In either case, writing to multiple addresses and then reading from one of these addresses may expose certain types of memory faults, such as coupling faults, stuck-at faults, pattern sensitivity faults, and other commonly known memory faults.

After the read and capture operation has been conducted, unloading of test result data may commence (block 530). The hold enable signal may be de-asserted, while the first scan enable signal ('scan enable') may be re-asserted. Shift operations may then begin, shifting the captured data out from the IC into test system 5. Once the unloading has completed, analysis of the test data may be performed to determine whether or not memory array 100 meets specifications.

FIG. 6 is a timing diagram illustrating states of various signals during scan test operations performed on one embodiment of IC 10 including memory array 100. The timing diagram shown may be divided into three different phases—scan load, capture/test, and scan unload. During the scan load portion, test stimulus data is loaded into one or more scan chains. The scan enable signals 'scan enable' and 'scan enable collar' may both be asserted during the scan load operation. The former of these two signals may be provided to each instance of scan element 25 present in the scan chain (or chains) being loaded, while the latter of these two signal may be provided to each instance of scan element 50. The hold enable, write enable, and read enable signals are held in a de-asserted state during scan load operations.

Scan load operations are synchronized to the clock signal ('Clk'). During the scan load portion, the clock runs at a slower speed relative to the at-speed clock frequency. In embodiments where multiple operational clock frequencies may be utilized, the clock signal may run at a clock frequency that is lower than the highest operational clock frequency.

After the scan load operation is complete, the clock may momentarily be stopped, as the capture/test phase begins. Upon entering the capture/test phase, the first scan enable signal ('scan enable') may be de-asserted, while the second scan enable signal ('scan enable collar') remains in an asserted state. Furthermore, the hold enable signal may also be asserted. Referring momentarily back to FIG. 3, when both the hold enable and scan enable collar signals are asserted, selection circuit 58 is configured to provide one of the true (Q)

or complementary (Q-bar) outputs from flip-flop 55 back to its D input, via selection circuits 58, 57, and 56.

The test routine may commence by asserting the write enable signal and cycling the clock signal at its operational frequency (or highest operational frequency in embodiments where multiple frequencies are possible). In this particular example, the write enable signal remains asserted for two clock cycles, after which it is de-asserted (e.g., by the invert enable signal received from the corresponding group of scan elements 25). With the write enable signal asserted for two consecutive clock cycles, data may be written to two different addresses of memory array 100. Following de-assertion of the write enable signal, the read enable signal may be asserted for one additional clock cycle. When the read enable signal is asserted for a clock cycle, data may be read from an address of memory array 100 and captured in scan elements (e.g., scan elements 25) coupled to a read port of memory array 100. Following the last clock cycle of the capture/test phase, the read enable signal may again be de-asserted and the clock signal may once again be momentarily halted.

The third phase in the example shown is the scan unload phase, in which test results are output. This phase may commence with the de-assertion of the hold enable signal and the reassertion of the first scan enable signal, followed by the cycling of the clock at the slow clock frequency (i.e. the same frequency used during scan load operations). The captured test result data may then be shifted from IC 10 to test system 5, where it may be subsequently analyzed to determine the results of the test.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
a scan chain having a plurality of serially coupled scan elements, wherein at least a subset of the plurality of scan elements are coupled to provide signals to a memory array, and wherein each of the subset of the plurality of scan elements includes:
a flip flop having a data input, and a data output coupled to a corresponding input of the memory array; and
selection circuitry configured to, in an operational mode, couple a data path to the data input, and further configured to, in a scan mode, couple to the data input one of a scan input, the data output, and a complement of the data output, wherein the selection circuitry includes:
a first selection circuit having a first output coupled to the data input and a first select input coupled to receive a scan enable signal;
a second selection circuit having a second output coupled to the first selection circuit and a second select input coupled to receive a hold enable signal; and
a third selection circuit having a third output coupled to the second selection circuit and a third select input coupled to receive an invert enable signal.

2. The integrated circuit as recited in claim 1, wherein the third selection circuit is configured to:
select the complement of the data output when the invert enable signal is asserted; and
select the data output when the invert enable signal is not asserted;
wherein the second selection circuit is configured to:
select the scan input when the hold enable signal is not asserted; and
select an output of the third multiplexer when the hold enable signal is asserted; and
wherein the first selection circuit is configured to:
select the data path when the scan enable signal is not asserted; and
select an output of the second multiplexer when the scan enable signal is asserted.

3. The integrated circuit as recited in claim 1, further comprising an array of shift registers, wherein an output of each of the shift registers is coupled to provide a corresponding invert enable signal to a corresponding one of the scan elements.

4. The integrated circuit as recited in claim 3, wherein each of the shift registers includes a plurality of serially coupled scan elements.

5. The integrated circuit as recited in claim 4, wherein the plurality of scan elements of scan chain includes the plurality of serially coupled scan elements of the shift registers.

6. The integrated circuit as recited in claim 1, wherein at least one of the subset of the plurality of scan elements is coupled to provide a write enable signal to the memory array.

7. The integrated circuit as recited in claim 1, wherein at least one of the subset of the plurality of scan elements is coupled to provide a read enable signal to the memory array.

8. The integrated circuit as recited in claim 1, wherein two or more of the subset of the plurality of scan elements are coupled to provide data signals to the memory array.

9. The integrated circuit as recited in claim 1, wherein at least one of the subset of the plurality of scan elements is coupled to provide a CAM (content addressable memory) enable signal to the memory array.

10. The integrated circuit as recited in claim 1, wherein the flip-flop of each of the plurality of scan elements is coupled to receive a clock signal, wherein, during scan operations, the clock signal has a first frequency, and wherein during test operations, the clock signal has a second frequency, wherein the second frequency is greater than the first frequency, and wherein the second frequency is the operational clock frequency of the memory array.

11. A method comprising:
loading test stimulus data into a scan chain of an integrated circuit (IC), the scan chain having a plurality of serially coupled scan elements each including a flip-flop having a data input and a data output, wherein said loading includes loading an initial test stimulus data into a subset of the plurality of scan elements, wherein each scan element of the subset is coupled to provide signals for input into a memory array;
initiating a memory test operation by providing the initial test stimulus data from the subset of the plurality of scan elements to the memory array;
providing additional test stimulus data to the memory array for a plurality of clock cycles by coupling to the data input of each scan element of the subset, one of the data output or a complement of the data output, wherein the test operation is performed at an operational clock speed of the memory array;
capturing test result data from the memory array; and
outputting the test result data from the scan chain;
wherein the method further comprises providing first and second scan enable signals during said loading, de-asserting the first scan enable signal during test operations while continuing to assert the second scan enable signal, and re-asserting the first scan enable signal during said outputting.

12. The method as recited in claim 11, further comprising providing an invert enable signal to at least one of the scan elements of the subset during the memory test operation, wherein the invert enable signal, when asserted, causes the complement of the data output to be provided to the data input of the respective scan element.

13. The method as recited in claim 11, further comprising providing a hold enable signal to the subset of the plurality of scan elements.

14. The method as recited in claim 11, wherein the test operation includes:
   providing a write enable signal from one of the subset of the plurality of scan elements;
   writing first data to a first address of the memory array from selected scan elements of the subset;
   writing second data to a second address of the memory array from the selected scan elements;
   de-asserting the write enable signal and asserting a read enable signal; and
   reading the second address, wherein said reading comprises said capturing the test result.

15. An integrated circuit comprising:
   a scan chain having a plurality of serially coupled scan elements, wherein a subset of the plurality of scan elements are coupled to provide signals to a memory array, and wherein each of the subset of the plurality of scan elements includes:
      a flip flop having a data input, and a data output coupled to the memory array; and
      a first selection circuit having a first output coupled to the data input of the flip flop;
      a second selection circuit having a second output coupled to the first selection circuit; and
      a third selection circuit having a third output coupled to the second selection circuit;
   wherein, when a scan enable signal received by the first selection circuit is in a first state, the first selection circuit is configured to couple a data path to the data input based on a scan enable signal; and
   wherein, when the scan enable signal is in a second state, the first, second, and third selection circuits are configured to couple one of a scan input, the data output, or a complement of the data output to the data input based on respective states of a hold enable signal and an invert enable signal.

16. The integrated circuit as recited in claim 15, wherein the first selection circuit is coupled to receive the scan enable signal as a select input, wherein the second selection circuit is coupled to receive the hold enable signal, and wherein the third selection circuit is coupled to receive the invert enable signal.

17. The integrated circuit as recited in claim 16, wherein the third multiplexer is configured to:
   select the complement of the data output when the invert enable signal is asserted; and
   select the data output when the invert enable signal is not asserted;
   wherein the second multiplexer is configured to:
   select the scan input when the hold enable signal is not asserted; and
   select an output of the third multiplexer when the hold enable signal is asserted; and
   wherein the first multiplexer is configured to:
   select the data path when the scan enable signal is not asserted; and
   select an output of the second multiplexer when the scan enable signal is asserted.

18. The integrated circuit as recited in claim 17, wherein the flip-flop of each of the plurality of scan elements is coupled to receive a clock signal, wherein, during scan operations, the clock signal has a first frequency, and wherein during test operations, the clock signal has a second frequency, wherein the second frequency is greater than the first frequency, and wherein the second frequency is the operational clock frequency of the memory array.

* * * * *

UNITED STATES PATENT AND TRADEMARK OFFICE
CERTIFICATE OF CORRECTION

PATENT NO. : 8,065,572 B2  
APPLICATION NO. : 12/495158  
DATED : November 22, 2011  
INVENTOR(S) : Thomas A. Ziaja et al.

Page 1 of 1

It is certified that error appears in the above-identified patent and that said Letters Patent is hereby corrected as shown below:

Title Page, Item (75) Inventorship:

The correct spelling of the inventors are:

Thomas A. Ziaja, Murali Gala, Paul J. Dickinson, Karl P. Dahlgren, David L. Curwen, ~~Oliver~~ <u>Olivier</u> Caty, Steven C. Krow-Lucal, James C. Hunt, and Poh-Joo Tan Signed and Sealed this  
Tenth Day of January, 2012

David J. Kappos  
*Director of the United States Patent and Trademark Office*